United States Patent [19]
Okase et al.

[11] Patent Number: 5,427,625
[45] Date of Patent: Jun. 27, 1995

[54] METHOD FOR CLEANING HEAT TREATMENT PROCESSING APPARATUS

[75] Inventors: Wataru Okase; Masaaki Hasei, both of Sagamihara, Japan

[73] Assignees: Tokyo Electron Kabushiki Kaisha; Tokyo Electron Tohoku Kabushiki Kaisha, both of Japan

[21] Appl. No.: 163,799

[22] Filed: Dec. 9, 1993

[30] Foreign Application Priority Data

Dec. 18, 1992 [JP] Japan .................. 4-354909

[51] Int. Cl.⁶ .............................................. B08B 5/04
[52] U.S. Cl. .................. 134/21; 134/22.12; 134/22.18; 134/22.1; 134/18
[58] Field of Search .............. 134/21, 22.12, 22.18, 134/22.1, 18

[56] References Cited

U.S. PATENT DOCUMENTS

| | | | |
|---|---|---|---|
| 3,479,679 | 11/1969 | Vogel | 134/22.18 |
| 3,860,018 | 1/1975 | Reiter | 134/22.18 |
| 5,217,501 | 6/1993 | Fuse et al. | 29/25.01 |
| 5,314,574 | 5/1994 | Takahashi | 156/646 |

FOREIGN PATENT DOCUMENTS 4-135601  5/1992  Japan .

Primary Examiner—Melvyn J. Andrews
Assistant Examiner—Zeinab El-Arini
Attorney, Agent, or Firm—Beveridge, DeGrandi, Weilacher & Young

[57] ABSTRACT

While the interior of a reaction vessel is being deaerated by a first vacuum pump, an inert gas is supplied from an upstream side (reaction gas bottle side) of a flow rate control unit (MFC) to a reaction gas supply pipe. Thus, a reaction gas is substituted with the inert gas. A passageway downstream of the MFC is closed and the interior of the pipe is deaerated from the upstream side through a bypass pipe so that a predetermined degree of vacuum is obtained. Thus, the gas substituting efficiency can be improved. The interior of the reaction vessel and the interior of the reaction gas supply pipe are quickly deaerated without an influence of resistance of the MFC. The inert gas substitution process and the deaerating process are repeated for 10 cycles or more.

6 Claims, 2 Drawing Sheets

FIG. I

METHOD FOR CLEANING HEAT TREATMENT PROCESSING APPARATUS

BACKGROUND OF THE INVENTION

1. Field of the Invention

The present invention relates to a heat treatment processing apparatus and a cleaning method thereof, in particular, to a heat treatment apparatus for diffusing impurities in a workpiece such as a semiconductor wafer and a cleaning method thereof.

2. Description of the Related Art

In a fabrication process of a semiconductor device, a thin film, an oxide film, or the like is deposited over a semiconductor wafer or the like. When impurities are diffused in a semiconductor wafer, a CVD apparatus, an oxide film forming apparatus, a diffusing apparatus or the like is used. These apparatuses have a heat treatment apparatus. The heat treatment apparatus has a reaction vessel in which many wafers are simultaneously processed with a reaction gas which is heated at a high temperature. Thus, the heat treatment processing apparatus has been widely used in the field of the semiconductor fabrication. However, the heat treatment apparatus requires a flow rate control unit which properly controls the flow rate of the reaction gas supplied to the reaction vessel. As an example of the flow rate control unit, a mass flow controller which has a gas flow rate detecting sensor and a flow rate controlling means which closes and opens a passageway of a reaction gas corresponding to a value detected by the gas flow rate detecting sensor.

The heat treatment processing apparatus is provided with a final filter disposed in the middle of a reaction gas supply pipe connected between the reaction vessel and the mass flow controller. The final filter captures particles contained in the reaction gas. A liquified substance of the reaction gas and the like adhere to the filter. Thus, the filter tends to clog. In addition, the liquified substance of the reaction gas and the like adhere to an orifice portion of the mass flow controller. Thus, the mass flow controller also tends to clog. Therefore, the interior of the reaction gas supply pipe should be periodically deaerated so as to clean the liquefied substance of the reaction gas and the like which adhere to the filter. However, if an inflammable gas or a poisonous gas is used as the reaction gas, before the interior of the reaction gas supply pipe is deaerated, an inert gas such as nitrogen gas $N_2$ should be supplied into the reaction gas supply pipe so as to substitute the reaction gas with the inert gas. Thus, the heat treatment processing apparatus has an inert gas supply source and a vacuum pump. The inert gas supply source and the vacuum pump are disposed on an upstream side of the mass flow controller and on a downstream side thereof, respectively. The inert gas supply pipe and the vacuum exhaust pipe each have a valve. In addition, the reaction gas supply pipe has valves on a reaction vessel side (downstream side) and a reaction gas supply source side (upstream side). By properly opening and/or closing these valves, the reaction gas is supplied to the reaction vessel, the interior of the reaction gas supply pipe is deaerated, and the inert gas is supplied to the reaction gas supply pipe.

In other words, when wafers are processed, both the valves on the upstream side and the downstream side of the reaction gas supply pipe are opened. In addition, the valves on the inert gas supply pipe and the vacuum exhaust pipe are closed. In this condition, the reaction gas is supplied from the reaction gas supply source to the reaction vessel through the filter, the mass flow controller, and the final filter so as to process the semiconductor wafers. At this point, the reaction vessel is deaerated to a predetermined degree of vacuum by the vacuum pump disposed on a downstream side thereof. The waste gas is sent to a gas processing unit through a vacuum pump.

On the other hand, when the interior of the reaction gas supply pipe is deaerated and cleaned, the valve on the upstream side of the reaction gas supply pipe and the valve for the vacuum exhaust pipe are closed and the valve for the inert gas supply pipe is opened so as to supply the inert gas from the inert gas supply source to the reaction gas supply pipe and substitute the reaction gas with the inert gas. This gas substitution is performed by the inert gas supplied from the upstream side (primary side). After the reaction gas in the reaction gas supply pipe is substituted with the inert gas, the valve for the inert gas supply pipe is closed and the valve for the vacuum exhaust pipe is opened so as to deaerate the interior of the reaction gas supply pipe both from the vacuum exhaust pipe side and the reaction vessel side. By performing the deaerating process, a liquified substance of the reaction gas and the like which adhere to the final filter are removed. After this deaerating process is properly performed, the valve for the vacuum exhaust pipe is closed so as to complete the cleaning process. After the cleaning operation is completed, new wafers, which have not been processed, are set in the reaction vessel. By opening the valve on the primary side of the reaction gas supply pipe, the reaction gas is supplied to the reaction vessel so as to process these wafers.

Thus, since the interior of the reaction gas supply pipe is deaerated and cleaned before new wafers are processed, the final filter and the mass flow controller can be prevented from clogging. In addition, when the wafers are processed, the reaction gas can be always supplied at a proper flow rate.

However, in the above-mentioned cleaning method, since the inert gas is supplied from the upstream side of the apparatus through the narrow orifice portion of the mass flow controller, the gas substituting efficiency is low. In addition, when the interior of the reaction gas supply pipe is deaerated from the downstream side thereof, the orifice portion of the mass flow controller disturbs the deaerating process. Thus, the interior of the reaction gas supply pipe is not quickly deaerated, but gradually. Therefore, the cleaning process for the interior of the reaction gas supply pipe takes a long time.

To prevent this problem, a bypass pipe which has an open/close valve and detours around the mass flow controller is disposed in the middle of the reaction gas supply pipe. When the reaction gas is supplied, the open/close valve for the bypass pipe is closed. When the gas substituting process is performed, this valve is opened so as to supply the gas. Thus, the inert gas can be smoothly supplied to the downstream side of the mass flow controller. However, the deaerating efficiency is still low. In addition, the reaction gas which resides in the bypass pipe tends to corrode it.

SUMMARY OF THE INVENTION

The present invention has been made from the above-mentioned point of view. An object of the present invention is to provide a heat treatment processing apparatus and a cleaning method thereof for improving deaerating efficiency and gas substituting efficiency in a reaction gas supply pipe and for quickly performing a cleaning process for a filter and the like disposed in the reaction gas supply pipe.

A first aspect of the present invention is a cleaning method of a heat treatment processing apparatus having a reaction vessel connected to a reaction gas supply pipe and a waste gas exhaust pipe, and a flow rate control unit disposed at said reaction gas supply pipe, said method comprising: a first step of deaerating the interior of said waste gas exhaust pipe and supplying an inert gas from an upstream side of said flow rate control unit to said reaction gas supply pipe so as to substitute said reaction gas in said reaction gas supply pipe and said reaction vessel with said inert gas; and a second step of deaerating the interior of said waste gas exhaust pipe, closing said reaction gas supply pipe at a closing point on a downstream side of said flow rate control unit so as to deaerate the interior of said reaction gas supply pipe on a downstream side of said closing point and the interior of said reaction vessel, and deaerating the interior of said reaction gas supply pipe on an upstream side of said flow rate control unit.

A second aspect of the present invention is a heat treatment processing apparatus, comprising a reaction vessel connected to a reaction gas supply pipe and a waste gas exhaust pipe, a flow rate control unit disposed at said reaction gas supply pipe, reaction gas supply means connected to said reaction gas supply pipe on an upstream side of said flow rate control unit through a reaction gas supply valve, inert gas supply means connected to said reaction gas supply pipe on an upstream side of said flow rate control unit through an inert gas supply valve, a vacuum pump disposed at said waste gas exhaust pipe, a bypass pipe for connecting said reaction gas supply pipe on the upstream side of said flow rate control unit and said waste gas exhaust pipe on the upstream side of said vacuum pump, a reaction gas pipe valve disposed at said reaction gas supply pipe on a downstream side of said flow rate control unit, and a bypass pipe valve disposed at said bypass pipe.

A third aspect of the present invention is a heat treatment processing apparatus, comprising: a reaction vessel connected to a reaction gas supply pipe and a waste gas exhaust pipe, a flow rate control unit disposed at said reaction gas supply pipe, reaction gas supply means connected to said reaction gas supply pipe on an upstream side of said flow rate control unit through a reaction gas supply valve, inert gas supply means connected to said reaction gas supply pipe on an upstream side of said flow rate control unit through an inert gas supply valve, a first vacuum pump connected to said waste gas exhaust pipe, a second vacuum pump connected to said reaction gas supply pipe on the upstream side of said flow rate control means through a vacuum pump valve, and a reaction gas pipe valve disposed at said reaction gas supply pipe on a downstream side of said flow rate control unit.

According to the first aspect of the present invention, since an inert gas is supplied from an upstream side of a flow rate control unit to a reaction gas supply pipe while the interior of a reaction vessel is being always deaerated, the reaction gas is effectively and quickly replaced with the inert gas. After the gas replacing operation is completed, a passageway in the vicinity on a downstream side of the flow control unit is closed and the interior of the reaction gas supply pipe is deaerated from the upstream side thereof, the interior of the flow rate control unit is deaerated and thereby a liquified substance of the reaction gas and the like which adhere to an orifice portion and the like of the passageway is removed. On the other hand, since the interior of the pipe on the downstream side is deaerated from the reaction vessel side, a predetermined degree of vacuum can be quickly obtained. Thus, a liquified substance of the reaction gas and the like which adhere to a filter disposed in the middle of the pipe is vaporized and removed. Since the cleaning process is performed before next reaction gas is supplied, the filter and the flow rate control unit can be prevented from clogging. In addition, clean reaction gas can be supplied to the reaction vessel at a proper flow rate. Since the deaerating efficiency and gas substituting efficiency are high, the cleaning process can be performed in a short time and thereby the fabrication yield can be improved.

According to the second aspect of the present invention, a valve for a reaction gas supply means is closed. The interior of a waste gas exhaust pipe is deaerated by a vacuum pump. A valve for an inert gas supply means is opened so as to supply an inert gas to a reaction gas supply pipe. Thus, the reaction gas in the reaction gas supply pipe and the reaction vessel is substituted with the inert gas. Thereafter, a valve for the reaction gas supply pipe on a downstream side of a flow rate control unit is closed and a valve for a bypass pipe is opened. Thus, the interior of the reaction gas supply pipe on the downstream side of the flow rate control unit and the interior of the reaction vessel are deaerated. In addition, the interior of the reaction gas supply pipe on the upstream side of the flow rate control unit is deaerated.

According to the third aspect of the present invention, a valve for a reaction gas supply means is closed. The interior of a waste gas exhaust pipe is deaerated by a first vacuum pump. A valve for an inert gas supply means is opened. Thus, an inert gas is supplied to a reaction gas supply pipe. The reaction gas in the reaction gas supply pipe and the reaction vessel is substituted with the inert gas. A valve for the reaction gas supply pipe on the downstream side of a flow rate control unit is closed. Thus, the interior of the reaction gas supply pipe on the downstream side of the flow rate control unit and the interior of the reaction vessel are deaerated. Thereafter, a valve for a second vacuum pump is opened. Thus, the interior of the reaction gas supply pipe on the upstream side of the flow control unit is deaerated by the second vacuum pump.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENT

Next, with reference to FIGS. 1 and 2, a heat treatment processing apparatus and a cleaning method thereof according to an embodiment of the present invention will be described.

Figure 1:
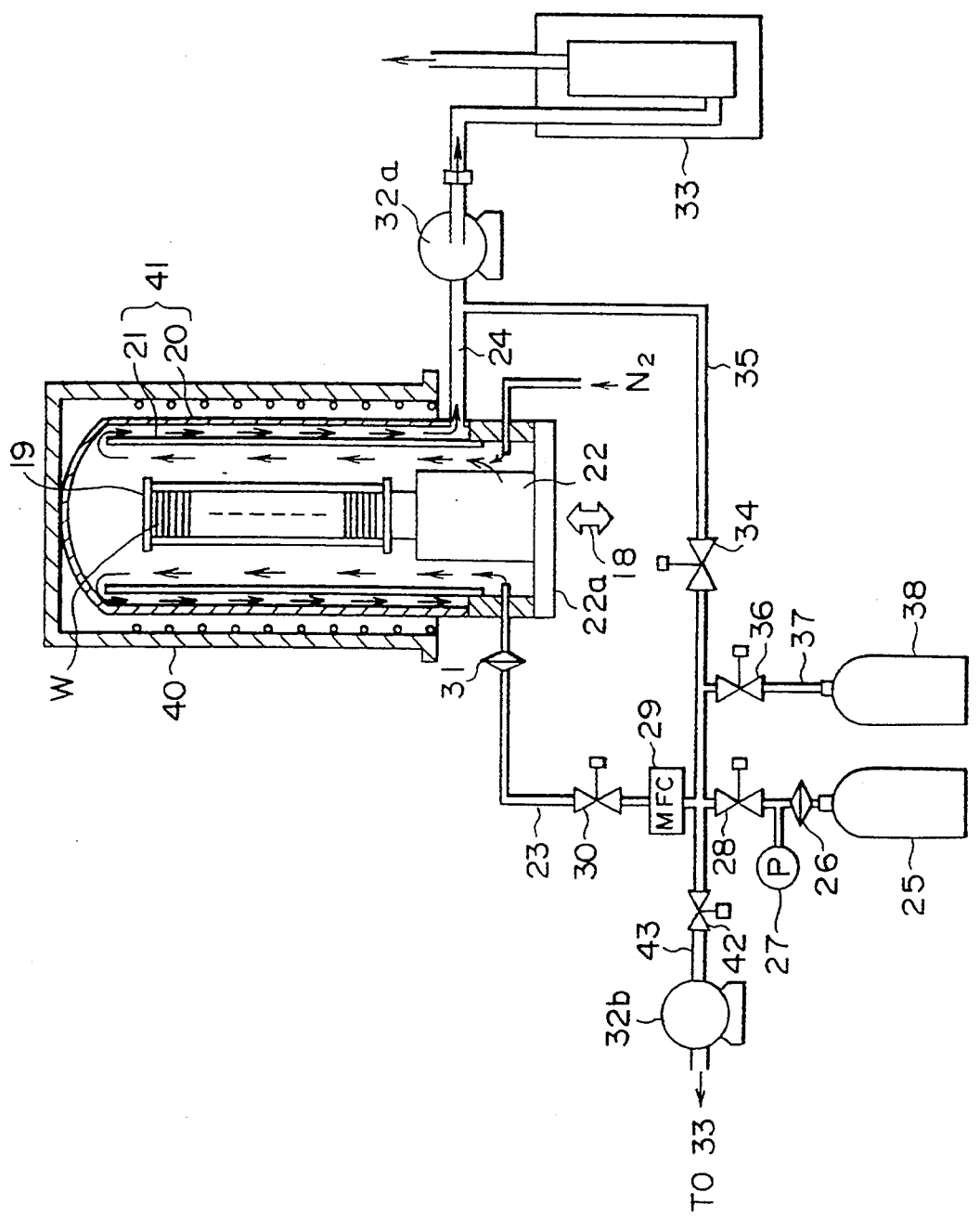
FIG. 1 is a block diagram showing a heat treatment processing apparatus and a cleaning method thereof according to an embodiment of the present invention.

FIG. 1 shows a batch type vertical heat treatment processing apparatus. The apparatus comprises a heating furnace 40, a reaction vessel 41, and a heat treatment processing boat 19. The reaction vessel 41 is made of quartz and disposed within the heating furnace 40. The heat treatment processing boat 19 is made of quartz and horizontally holds a large number of workpieces W such as semiconductor wafers. The heat treatment processing boat 19 is moved in a direction shown by an arrow 18 so as to load and unload the workpieces W to and from the reaction vessel 41.

The reaction vessel 41 has a dual-cylinder construction constructed of an outer cylinder 20 and an inner cylinder 21. The inner cylinder 21 is coaxially disposed within the outer cylinder 20. The inner cylinder 21 has an upper opening portion and a lower opening portion. The outer cylinder 20 has a lower opening portion. Thus, the reaction vessel 41 has a lower opening portion. When the heat treatment processing boat 19 is loaded into the reaction vessel 41, the opening portion of the reaction vessel 41 is airtightly sealed by a cap 22a of a heat insulating cylinder 22 disposed at the lower end of the heat treatment processing boat 19.

A reaction gas supply pipe 23 and a waste gas exhaust pipe 24 are connected to the lower end portion of the reaction vessel 41. A reaction gas bottle 25 which contains a reaction gas such as dichlorosilane (SiH2Cl2) is disposed at an upstream end of the reaction gas supply pipe 23. A primary side filter 26, a pressure gauge 27, a first valve 28, a mass flow controller (flow rate control unit) MFC 29, a second valve 30, and a final filter 31 are disposed at the middle of the reaction gas supply pipe 23 which is connected from the reaction gas bottle 25 to the reaction vessel 41. On the other hand, a first vacuum pump 32a is connected to the waste gas exhaust pipe 24. A gas processing unit 33 is disposed downstream of the first vacuum pump 32a.

In the above-described vertical heat treatment processing apparatus, the first vacuum pump 32a adjusts the vacuum state of the reaction vessel 41. Both the first and second valves 28 and 30 are opened so as to supply the reaction gas from the reaction gas bottle 25 through the primary filter 26, which removes particles contained in the reaction gas. The flow rate of the reaction gas is controlled by an orifice portion (not shown) of the MFC 29. In addition, a liquified substance of the reaction gas and the like are removed by the final filter 31. The rest of the reaction gas is supplied to the reaction vessel 41. After the reaction gas is used to process the workpieces W, the waste gas is sent to the gas processing unit 33 through the waste gas exhaust pipe 24. The gas processing unit 33 makes the waste gas harmless and exhausts the harmless gas to the exterior of the apparatus.

However, as described above, since the final filter 31 and the MFC 29 collect a liquefied substance of the process gas and the like, they tend to clog. Thus, the interior of the reaction gas supply pipe 23 should be properly deaerated so as to clean the final filter 31 and the mass flow controller 29.

In the vertical heat treatment processing apparatus according to the embodiment, to clean the MFC 29 and the final filter 31 according to a cleaning method of the present invention, a cleaning bypass pipe 35 with a third valve 34 is connected from the reaction gas supply pipe 23 on an upstream side of the MFC 29 to the waste gas exhaust pipe 24 on a upstream side of the first vacuum pump 32a. In addition, an inert gas bottle 38 which contains an inert gas such as nitrogen (N2) is connected to a point of the bypass pipe 35 between the third valve 34 and the reaction gas supply pipe 23. The third and fourth valves 34 and 36 and the first and second valves 28 and 30 are individually opened and/or closed, so that the reaction gas is be supplied to the reaction vessel 41, the interior of the reaction gas supply pipe is deaerated, and the inert gas is supplied to the reaction gas supply pipe. In addition, a second vacuum pump 32b is connected to the reaction pipe gas supply pipe 23 on an upstream side of the MFC 29 through a joint pipe 43 with a fifth valve 42. The second vacuum pump 32b is not always required.

When a heat diffusing process is performed for the workpieces W by the vertical heat treatment apparatus, the heat treatment processing boat 19 which horizontally holds the workpieces W is loaded into the reaction vessel 41 which is heated to a predetermined temperature by the heating furnace 40. At this point, the opening portion of the reaction vessel 41 is sealed with the cap 22a of the heat insulating cylinder 22. The first vacuum pump 32 is driven so as to keep the interior of the reaction vessel 41 at a predetermined degree of vacuum. In addition, both the first and second valves 28 and 30 of the reaction gas supply pipe 23 are opened so that the reaction gas is supplied to the reaction vessel 41 through the reaction gas supply pipe 23 at a predetermined flow rate for a predetermined period of time. Thus, a heat diffusing layer is formed on each of the workpieces W.

Next, the cleaning process according to the cleaning method of the present invention is performed. While the first vacuum pump 32a is always being driven, the first valve 28 is closed and the fourth valve 36 is opened so that the inert gas is supplied from the upstream side of the MFC 29 to the reaction gas supply pipe 23. Thus, the reaction gas within the reaction gas supply pipe 23 and the reaction vessel 41 are substituted with the inert gas. Since the inert gas for the gas substituting operation is supplied while the interior of the reaction gas supply pipe 23 is being deaerated, the gas substituting process is quickly and sufficiently performed. While the gas substituting process is being performed, the third valve 34 and the fifth valve 42 are closed (at step 1).

Next, the fourth valve 36 is closed so as to stop supplying the inert gas. The second valve 30 is closed so as to close the passageway on the downstream side of the MFC 29. Thereafter, the third valve 34 is opened. Thus, the interior of the reaction gas supply pipe 23 is deaerated from both the upstream side of the MFC 29 and the reaction vessel 41 side (downstream side). Since the interior of the reaction gas supply pipe 23 is deaerated from the upstream side of the MFC 29, the interior of the MFC 29 and the interior of the reaction gas supply pipe 23 on the upstream side of the MFC 29 are quickly deaerated to a predetermined degree of vacuum. Thus, a liquified substance of the reaction gas and the like which adhere to the orifice portion of the MFC 29 are vaporized and removed. In addition, since the interior of the pipe 23 on the downstream side of the second valve 30 is deaerated from the reaction vessel 41 side, the predetermined degree of vacuum is obtained without an influence of resistance of the MFC 29. Thus, the liquified substance of the reaction gas and the like which adhere to the final filter 31 are vaporized and removed (at second step). In this case, the fifth valve 42 may be opened so that the first vacuum pump 32a and the second vacuum pump 32b are driven. When the second vacuum pump 32b is driven, the interior of the reaction gas supply pipe 23 on the upstream side of the MFC 29 can be quickly deaerated. When the second vacuum pump 32b is driven, if the fourth valve 34 can be closed. In this case the bypass pipe 35 is not used.

In this embodiment, cycles consisting of the first step for substituting the reaction gas with the inert gas and the second step for deaerating the interior of the reaction gas supply pipe are repeated more than ten times. In other words, 10 cycles of the first step and the second step are performed. The first step of each cycle is performed within five seconds or less, preferably, within two seconds or less. The second step of each cycle is performed within five seconds or less, preferably, within two seconds or less. For example, when each of the first step and the second step is performed for two seconds and ten cycles of these steps are performed, the cleaning process is completed in a total of 40 seconds.

In the first step, the interior of the reaction vessel 41 and the interior of the reaction gas supply pipe 23 are pressurized to approximately 1500 to 1900 Torr. In the second step, the interior of the reaction vessel 41 and the interior of the reaction gas supply pipe 23 are deaerated to 300 Torr or below, preferably 70 Torr or below. By repeating the pressuring state (first step) and the deaerating state (second step)in a short time, a turbulence takes place within the reaction vessel 41 and the reaction gas supply pipe 23. Thus, the liquified substance of the reaction gas and the like which adhere to the MFC 29 and the final filter 31 can be easily peeled off and exhausted to the exterior of the apparatus together with the inert gas.

After the cleaning process is completed, the waste gas within the reaction vessel 41 is substituted with the inert gas. The heat treatment processing boat 19 is unloaded. The workpieces W which have been processed are removed from the heat treatment processing boat 19. Thereafter, next workpieces W which have not been processed are placed in the heat treatment processing boat 19. The heat treatment processing boat 19 is loaded into the reaction vessel 41. Thereafter, the fourth valve 36 is closed so as to stop supplying the inert gas. After the reaction vessel 41 is heated to a predetermined temperature for the heat treatment by the heating furnace 40, the first valve 28 is opened. Thus, the reaction gas is supplied to the reaction vessel 41 and the workpieces W are processed. While the wafers W are being processed, the third valve 34 and the fifth valve 42 are kept closed.

Thus, whenever the heat treatment process for workpieces W is completed, the interior of the reaction gas supply pipe 23 is cleaned. Consequently, the filter 31 and the MFC 29 can be prevented from clogging. In addition, since the reaction gas can be cleanly supplied to the reaction vessel 41 at a proper flow rate, the yield of the fabrication can be improved. Moreover, according to the cleaning method of the present invention, since the deaerating process for the interior of the reaction gas supply pipe 23 and the gas substituting process with the inert gas can be effectively and quickly performed, the cleaning period can be reduced and thereby the throughput of the fabrication can be improved.

Moreover, according to the cleaning method of the present invention, since a bypass pipe, which detours around the MFC 29 in the middle of the reaction gas supply pipe 23, can be omitted, it is not necessary to consider corrosion of such a pipe due to residual of the reaction gas. Furthermore, when the reaction gas supply pipe 23 and the waste gas exhaust pipe 24 are connected with the bypass pipe 35 and the interior of the reaction gas supply pipe 23 is deaerated both from the upstream side and the downstream side thereof by the first vacuum pump 32a, the apparatus can be operated with one piping system, thereby reducing the inner volume of the piping system and allowing the deaerating process to be performed in a short time.

Figure 2:
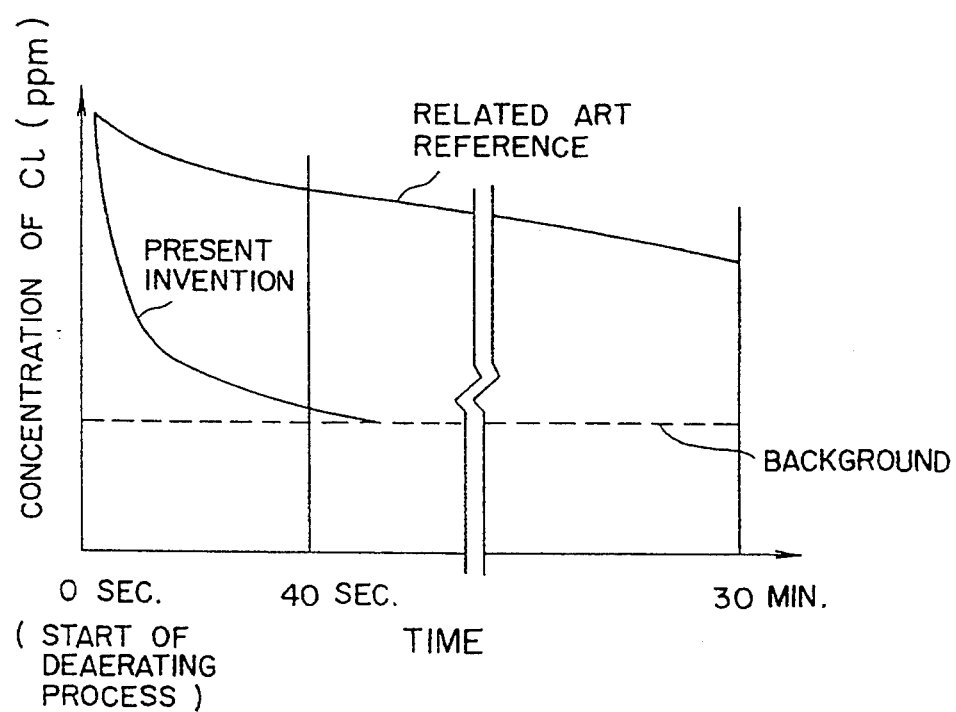
FIG. 2 is a graph showing results of measurements of deaerating processes in the present invention and a related art reference.

FIG. 2 is a graph showing results of measurements of the deaerating process for the reaction gas supply pipe according to the cleaning method of the present invention and a deaerating process for the same reaction gas supply pipe according to a conventional method. When the deaerating process according to the cleaning method of the present invention was performed, the concentration of $Cl_2$ was quickly lowered. Approximately, 40 second later, the level of the concentration reached the background level. On the other hand, in the conventional method, 40 seconds after the deaerating process was performed, the concentration of $Cl_2$ did not remarkably vary. Approximately 30 minutes after the deaerating process had been performed, the concentration of $Cl_2$ was much apart from the background level.

As described above, according to the heat treatment apparats and the cleaning method thereof of the present invention, the following excellent effects can be obtained.

Since an inert gas is supplied to the reaction gas supply pipe from the upstream side of the flow rate control unit while the interior of the reaction vessel is being deaerated, the gas substituting efficiency can be remarkably improved. In addition, after the gas substituting process is performed, the passageway in the vicinity of the downstream side of the flow rate control unit is closed and the interior of the reaction gas supply pipe is deaerated from the upstream side, the interior of the flow rate control unit is quickly deaerated. Thus, a liquified substance of the reaction gas and the like which adhere to the orifice portion of the flow rate control unit can be removed in a short time. Moreover, the interior of the pipe on the downstream side of the closed portion is deaerated from the reaction vessel side without an influence of resistance of the flow rate control unit. Thus, the liquified substance of the reaction gas and the like which adhere to the filter and the like disposed in the middle of the pipe can be removed in a short time.

Thus, since the apparatus can be cleaned in a short time, the throughput of the fabrication can be improved. In addition, since the cleaning process is performed before the next reaction gas is supplied, the filter and the flow rate control means can be prevented from clogging. Thus, the reaction gas can be cleanly supplied to the reaction vessel. Consequently, the yield of the fabrication can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A cleaning method for a heat treatment processing apparatus having a reaction vessel connected to a reaction gas supply pipe and a waste gas exhaust pipe, and a flow rate control unit disposed at said reaction gas supply pipe, said method comprising:

a first step of deaerating the interior of said waste gas exhaust pipe and supplying an inert gas from an upstream side of said flow rate control unit to said reaction gas supply pipe so as to replace said reaction gas in said reaction gas supply pipe and said reaction vessel with said inert gas, and to remove non-gaseous residues therefrom; and a second step of deaerating the interior of said waste gas exhaust pipe, closing said reaction gas supply pipe at a closing point on a downstream side of said flow rate control unit so as to deaerate and remove non-gaseous residues from the interior of said reaction gas supply pipe on a downstream side of said closing point and the interior of said reaction vessel, and deaerating the interior of said reaction gas supply pipe on an upstream side of said flow rate control unit.

2. The cleaning method as set forth in claim 1, wherein said second step is performed by deaerating the interior of said reaction gas supply pipe on the upstream side of said flow rate control unit through a bypass pipe connected between said reaction gas supply pipe and said waste gas exhaust pipe while the interior of said waste gas exhaust pipe is being deaerated.

3. The cleaning method as set forth in claim 1, wherein said second step is performed by deaerating the interior of said reaction gas supply pipe on the upstream side of said flow rate control unit irrespective of deaerating the interior of said waste gas exhaust pipe.

4. The cleaning method as set forth in claim 1, wherein said first and second steps are performed for 10 or more cycles.

5. The cleaning method as set forth in claim 4, wherein each of said first and second steps is performed within 5 seconds or less.

6. The cleaning method as set forth in claim 4, wherein said first step is performed by pressurizing the interior of said reaction vessel and the interior of said reaction gas supply pipe to between 1500 and 1900 Torr and wherein said second step is performed by deaerating the interior of said reaction vessel and the interior of said reaction gas supply pipe to 300 Torr or below.

* * * * *